United States Patent
Karidis et al.

(10) Patent No.: US 9,425,124 B2
(45) Date of Patent: Aug. 23, 2016

(54) COMPLIANT PIN FIN HEAT SINK AND METHODS

(75) Inventors: John P. Karidis, Ossining, NY (US); Mark D. Schultz, Ossining, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 924 days.

(21) Appl. No.: 13/364,907

(22) Filed: Feb. 2, 2012

(65) Prior Publication Data

US 2013/0199767 A1     Aug. 8, 2013

(51) Int. Cl.
| | |
|---|---|
| H01L 23/367 | (2006.01) |
| H01L 23/473 | (2006.01) |
| H01L 23/00 | (2006.01) |
| H01L 23/467 | (2006.01) |
| H01L 21/48 | (2006.01) |

(52) U.S. Cl.
CPC .......... *H01L 23/3677* (2013.01); *H01L 23/467* (2013.01); *H01L 23/473* (2013.01); *H01L 24/72* (2013.01); *H01L 21/4882* (2013.01); *H01L 2924/01322* (2013.01)

(58) Field of Classification Search
CPC ..... H01L 23/473; H01L 23/467; H01L 24/72; H01L 23/3677; H01L 2924/01322; H01L 21/4882; H01L 2924/00; F28B 1/02; F28F 3/12
USPC ........ 165/146, 80.4, 80.2, 170, 80.3; 361/699
See application file for complete search history.

(56) References Cited

U.S. PATENT DOCUMENTS

| | | | | |
|---|---|---|---|---|
| 2,595,457 A | * | 5/1952 | Jensen et al. | 165/166 |
| 4,654,754 A | | 3/1987 | Daszkowski | |
| 4,934,453 A | * | 6/1990 | Ganz et al. | 165/165 |
| 5,022,462 A | * | 6/1991 | Flint et al. | 165/80.4 |
| 5,159,531 A | | 10/1992 | Horvath et al. | |
| 5,168,348 A | * | 12/1992 | Chu et al. | 257/713 |
| 5,193,611 A | * | 3/1993 | Hesselgreaves | 165/165 |
| 5,583,317 A | | 12/1996 | Mennucci et al. | |
| 5,988,266 A | * | 11/1999 | Smith et al. | 165/78 |
| 6,050,332 A | * | 4/2000 | Smith et al. | 165/185 |
| 6,076,594 A | | 6/2000 | Kuo | |
| 6,131,644 A | * | 10/2000 | Kohara et al. | 165/10 |

(Continued)

FOREIGN PATENT DOCUMENTS

| | | |
|---|---|---|
| CN | 1980564 A | 6/2007 |
| JP | 3240408 A | 12/2001 |

OTHER PUBLICATIONS

Curamik. Division of Rogers Corporation. "Product Information | DBC Coolers | version 0.1" Copyrighted in 2012. (2 Pages) http://www.curamik.com/fileadmin/user_upload/downloads/Product_information_DBC_Cooler.PDF.

*Primary Examiner* — Tho V Duong
*Assistant Examiner* — Raheena Rehman
(74) *Attorney, Agent, or Firm* — Tutunjian & Bitetto, P.C.; Daniel P. Morris

(57) ABSTRACT

A heat sink includes a plurality of layers being disposed substantially parallel with a surface of a heat source. The layers include a plurality of pin portions spaced apart from each other in a planar arrangement wherein the pin portions of the layers are stacked and bonded to form pin fins extending in a transverse direction relative to the heat source to sink heat. A compliant layer is disposed between the pin fins and a mechanical load. The compliant layer provides compliance such that the pin fins accommodate dimensional differences when interfacing with the heat source.

16 Claims, 9 Drawing Sheets

Detail A

(56) References Cited

U.S. PATENT DOCUMENTS

| | | |
|---|---|---|
| 6,411,513 B1 | 6/2002 | Bedard |
| 6,622,786 B1 * | 9/2003 | Calmidi et al. ............... 165/185 |
| 6,840,308 B2 * | 1/2005 | Ritter et al. .................. 165/80.4 |
| 6,861,293 B2 * | 3/2005 | Soule ............................ 438/122 |
| 6,903,929 B2 * | 6/2005 | Prasher et al. ................ 361/699 |
| 6,968,892 B1 * | 11/2005 | Symonds ...................... 165/165 |
| 7,042,729 B2 | 5/2006 | Dias et al. |
| 7,200,006 B2 | 4/2007 | Farrow et al. |
| 7,264,041 B2 | 9/2007 | Karidis et al. |
| 7,355,855 B2 | 4/2008 | Karidis et al. |
| 7,362,582 B2 * | 4/2008 | Karidis et al. ................ 361/710 |
| 7,408,780 B2 | 8/2008 | Karidis et al. |
| 7,545,647 B2 | 6/2009 | Karidis et al. |
| 7,545,648 B2 | 6/2009 | Karidis et al. |
| 8,243,449 B2 * | 8/2012 | Oniki et al. .................... 361/700 |
| 8,844,134 B2 * | 9/2014 | Morino et al. ............. 29/890.03 |
| 2007/0000644 A1 * | 1/2007 | Campbell et al. ............ 165/80.4 |
| 2008/0190590 A1 | 8/2008 | Gillard et al. |
| 2009/0141451 A1 * | 6/2009 | Mori ................... H01L 23/3675 361/699 |
| 2009/0151893 A1 | 6/2009 | Karidis et al. |
| 2009/0314467 A1 * | 12/2009 | Campbell et al. ............ 165/80.4 |
| 2010/0170667 A1 * | 7/2010 | Bertolotti ................ F28F 1/124 165/166 |

* cited by examiner

Detail A

_US 9,425,124 B2_

COMPLIANT PIN FIN HEAT SINK AND METHODS

GOVERNMENT RIGHTS

This invention was made with Government support under Contract No.: HR0011-07-9-0002 awarded by the Defense Advanced Research Projects Agency (DARPA). The Government has certain rights in this invention.

BACKGROUND

1. Technical Field

The present invention relates to integrated circuit packaging, and more particularly to pin fin heat sinks and construction methods.

2. Description of the Related Art

Cooling semiconductor devices generally requires the use of a relatively thick Thermal Interface Material (TIM) to absorb differences in surface flatness between a heat sink and a device being cooled. These materials and the processes for inserting them into systems increase thermal resistance and decrease system reliability for a variety of reasons. Compliant Thermal Interface (CTI) heat sinks circumvent this issue by having a surface that can conform to a surface of a chip. Such systems typically include a metal spring layer. These systems are expensive. Related Compliant Pin Fin (CPF) heat sinks include a bed of rigid pins, which generally incorporate internal springs. However, a useable process for creating such devices for either Single Chip Modules (SCMs) or Multi-Chip Modules (MCMs) has not been available.

SUMMARY

A heat sink, in accordance with the present principles, includes a plurality of layers being disposed substantially parallel with a surface of a heat source. The layers include a plurality of pin portions spaced apart from each other in a planar arrangement wherein the pin portions of the layers are stacked and bonded to form pin fins extending in a transverse direction relative to the heat source to sink heat. At least one compliant layer is disposed between the pin fins and a mechanical load. The at least one compliant layer provides compliance such that the pin fins accommodate dimensional differences when interfacing with the heat source.

A heat sink includes a plurality of pin portions spaced apart from each other in a planar arrangement. The pin portions are thermally conductive. Links connect at least one set of adjacent pin portions of the plurality of pin portions to form a planar sheet such that a ratio of a width of the pin portions to a width of the links is configured to make the planar sheet flexible.

A method for forming a compliant heat sink includes providing a plurality of layers parallel with a surface of a heat source, where each layer includes a plurality of pin portions spaced apart from each other in a planar arrangement, and removable links connecting adjacent pin portions such that a ratio of a width of the pin portions to a width of the links is configured to make the planar sheet flexible; aligning pin portions of adjacent sheets; and bonding the pin portions of the adjacent sheets to form a stack of bonded sheets where the pin portions form columns of pin fins extending transversely from a heat source to heat sink the load.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
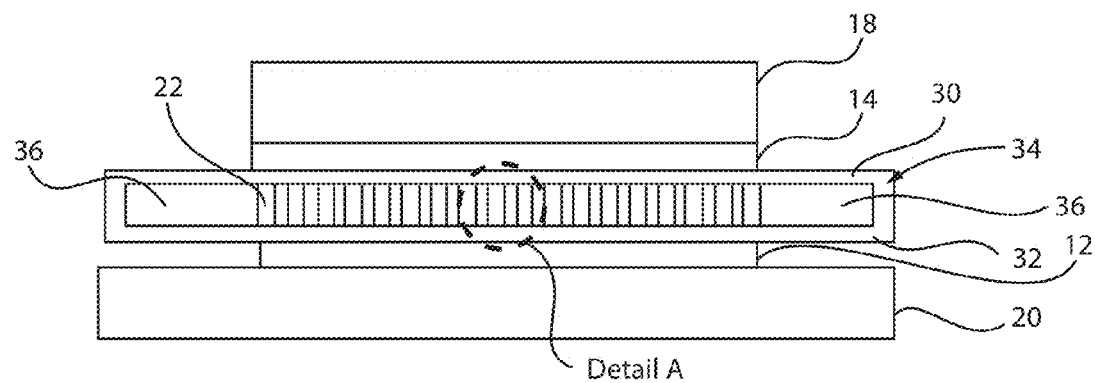
FIG. 1 is a side view of an illustrative heat sink system with pin fins in an enclosure without links shown between pin portions and employing a compliant sheet in accordance with the present principles.

In accordance with the present principles, pin fin compliant heat sinks (PFCHS) are provided. The heat sinks are formed using one or more sheets of pin forming structures. Multiple layers including such sheets of pin forming structures may be stacked to occupy a gap space between a heat source and a support structure. The layers may include compliant elements or may be disposed on a compliant element to provide compliance and accommodate different heights or gap distances that need to be bridged. The present embodiments provide an inexpensive fabrication process as well as a customizable and compliant fit for supporting loads and/or contacting heat sources, such as, e.g., chips or other electronic components. The stacking sheets are not limited to Single Chip Modules (SCMs) or Multi-Chip Modules (MCMs), but may be employed with any heat source that benefits from having a heat sink.

In accordance with particularly useful embodiments, pin fin compliant heat sinks (PFCHS) are fabricated by stacking sheets including thin sections of columnar pins one on top of the other and, generally, the stack is employed with a thin conformable interfacial sheet (e.g., an enclosure wall). The conformable interfacial sheet conforms to a device surface (e.g., heat source or a nearby structure). The conformable interfacial sheet may serve as a constraint to flowing coolant. Where there is a conformable interfacial sheet, a generally separate compliant sheet or layer forms a distributed spring to provide or adapt to a mechanical load over the columnar pin fins. The separate compliant layer may be disposed between a top layer (the conformable interfacial sheet) of an enclosure and the load structure to provide the compliant load through the top layer to the pin fins.

In one embodiment, the layers containing columnar pins preferably include locating connections or links between columnar sections. These connections or a portion thereof may be deleted or broken after assembly to permit each resulting pin to move or flex independently upon completion. The resulting pins may or may not be attached to conformable interfacial sheets or compliant layers. By removing the links, the resulting heat sink is even more flexible.

It is to be understood that the present invention will be described in terms of a given illustrative architecture having a heat source having a heat sink arrangement coupled thereto; however, other architectures, structures, materials and process features and steps may be varied within the scope of the present invention.

It will also be understood that when an element such as an interface layer, heat source, heat sink, etc. is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip package or device may be created in a graphical computer programming language, and stored in a computer storage medium (such as a disk, tape, physical hard drive, or virtual hard drive such as in a storage access network). If the designer does not fabricate chips or chip packages, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII), which typically include multiple copies of the chip package design.

Methods as described herein may be used in the fabrication of integrated circuit chips or chip packages. The resulting integrated circuit chips or chip packages can be distributed by the fabricator as a single chip package or multiple chip packages in a packaged form. Chips maybe mounted in a single chip package (such as a plastic carrier, with leads that are affixed to a motherboard or other higher level carrier) or in a multichip package (such as a ceramic carrier that has either or both surface interconnections or buried interconnections). The chips or chip packages may be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 2:
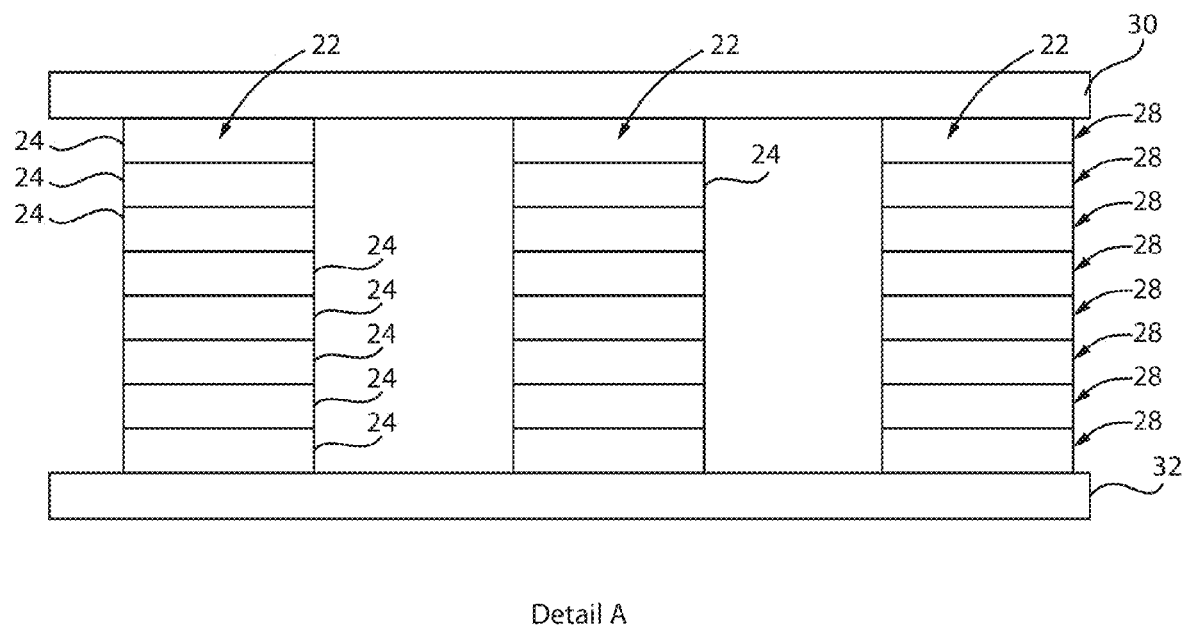
FIG. 2 is a magnified view of Detail A of FIG. 1 showing the pin portions in greater detail in accordance with the present principles.

Referring now to the drawings in which like numerals represent the same or similar elements and initially to FIGS. 1 and 2, an illustrative assembly 10 shows an exemplary arrangement for employing the present principles. Assembly 10 includes a substrate 20 that includes a heat generating source or heat source 12. Substrate 20 may include a printed wiring board, a cabinet structure, a wall of an architectural structure, etc. Heat source 12 may be any heat source or element that generates heat. In particularly useful embodiments, heat source 12 includes an integrated circuit, such as a chip or multi-chip package. In other embodiments, the heat source 12 may include a single or multiple electrical components, an electronic device or devices, a heating element (e.g., in molding applications), etc.

A coolant enclosure 34 is provided on the heat source 12 to draw heat therefrom. Coolant enclosure 34 includes layers of pin forming sheets 28, which are sandwiched between conformable sheets 30, 32 and bonded to at least one (preferably a bottom sheet 32) (chip/lid contacting). The bottom conformable sheet 32 preferably includes a heat conducting material. A periphery of the top and bottom sheets 30, 32 is connected together at a rim which provides for a sealed unit for the coolant enclosure 34. Access for coolant inlet and outlet is provided, usually in the top sheet 30 (see FIG. 3). Flexible flow blocking structures 36, which may include an elastomer material, prevent flow around the area containing pins.

Pin forming sheets 28 include removable links (not shown) that connect pin portions 24 in each layer 28. The pin portions 24 are stacked substantially parallel to each other and bonded to form columns 22. The pin area is loaded with a compliant pad, sheet or element(s) 14 between the pin area and a mechanical load 18. The load 18 is carried through the chip or lid 12 to the substrate 20.

Figure 3:
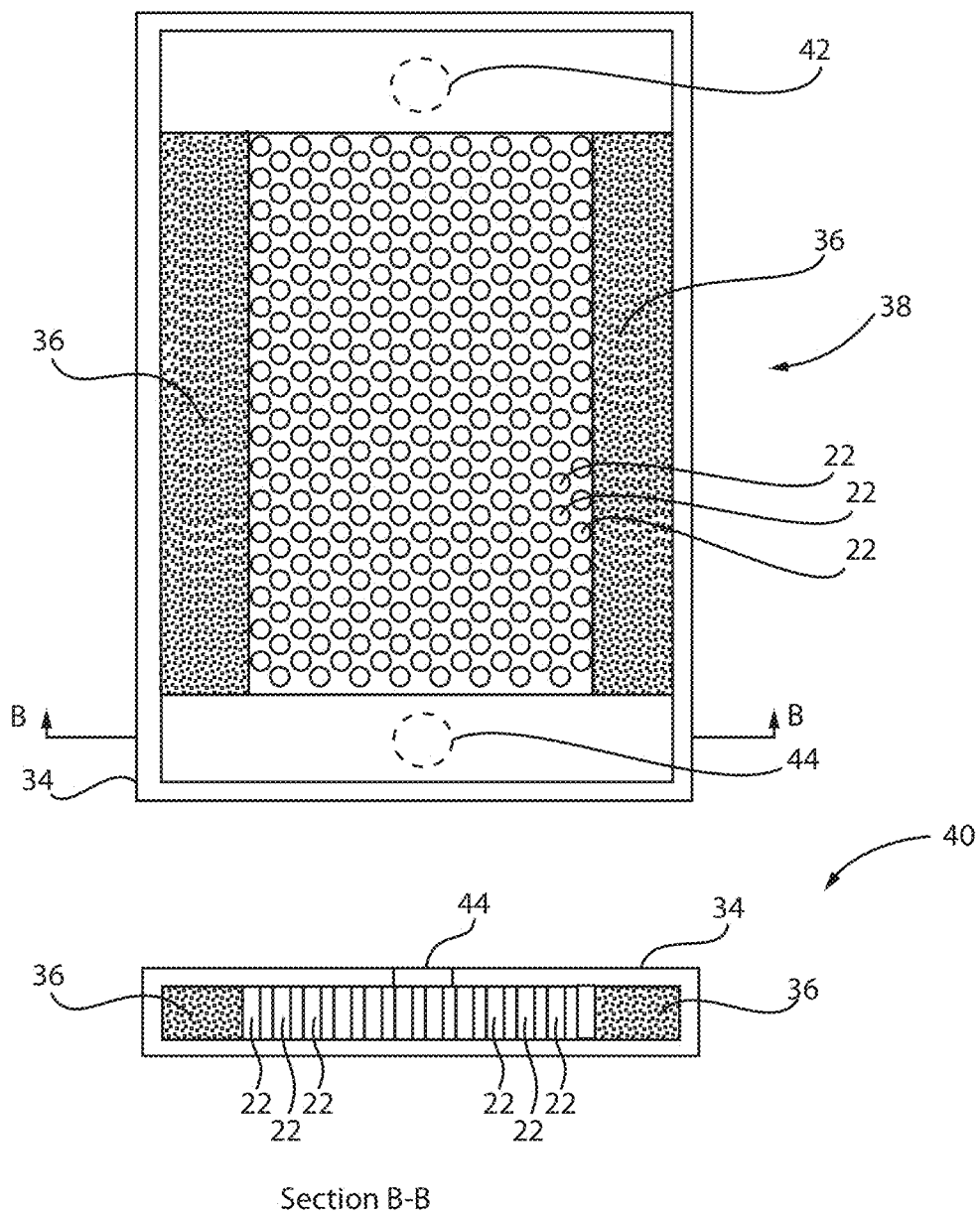
FIG. 3 is a top view of a coolant flow enclosure with a top layer removed and showing a cross-sectional view taken at section line B-B depicting pin fins in the enclosure without links shown between pin portions in accordance with one embodiment.

Referring to FIG. 3, a top view 38 and a more detailed cross-sectional view 40 of the enclosure 34 are illustratively shown. The top view 38 has the top layer 30 removed or includes an embodiment where the top layer 30 is not employed. The front view 40 is taken at section line B-B in view 38. A coolant inlet 42 and outlet 44 are illustratively depicted in the top view, but would normally be provided in the top layer 30 (or in a compliant layer 14, if the compliant layer 14 were employed to close off the enclosure 34). Coolant is introduced into the inlet 42, flows past the pin columns 22 and exits through the outlet 44. The coolant preferably includes water, water based solutions, glycol, air or other heat transfer fluids.

Figure 4:
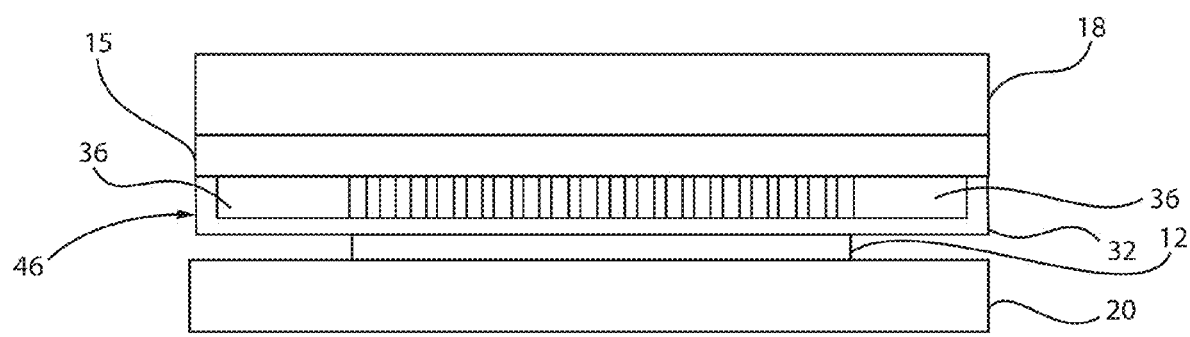
FIG. 4 is a side view of an illustrative heat sink system with pin fins in an enclosure without links shown where a portion if the enclosure includes a compliant sheet between pin portions in a heat sink stack in accordance with the present principles.

Referring to FIG. 4, an alternate arrangement for enclosure 34 includes a coolant enclosure 46. Enclosure 46 includes the bottom conformable sheet 30 with pin columns 22 bonded thereto, but includes a compliant layer 15 (similar in function and material as complaint layer 14) to complete the top layer of the enclosure 46.

Figure 5:
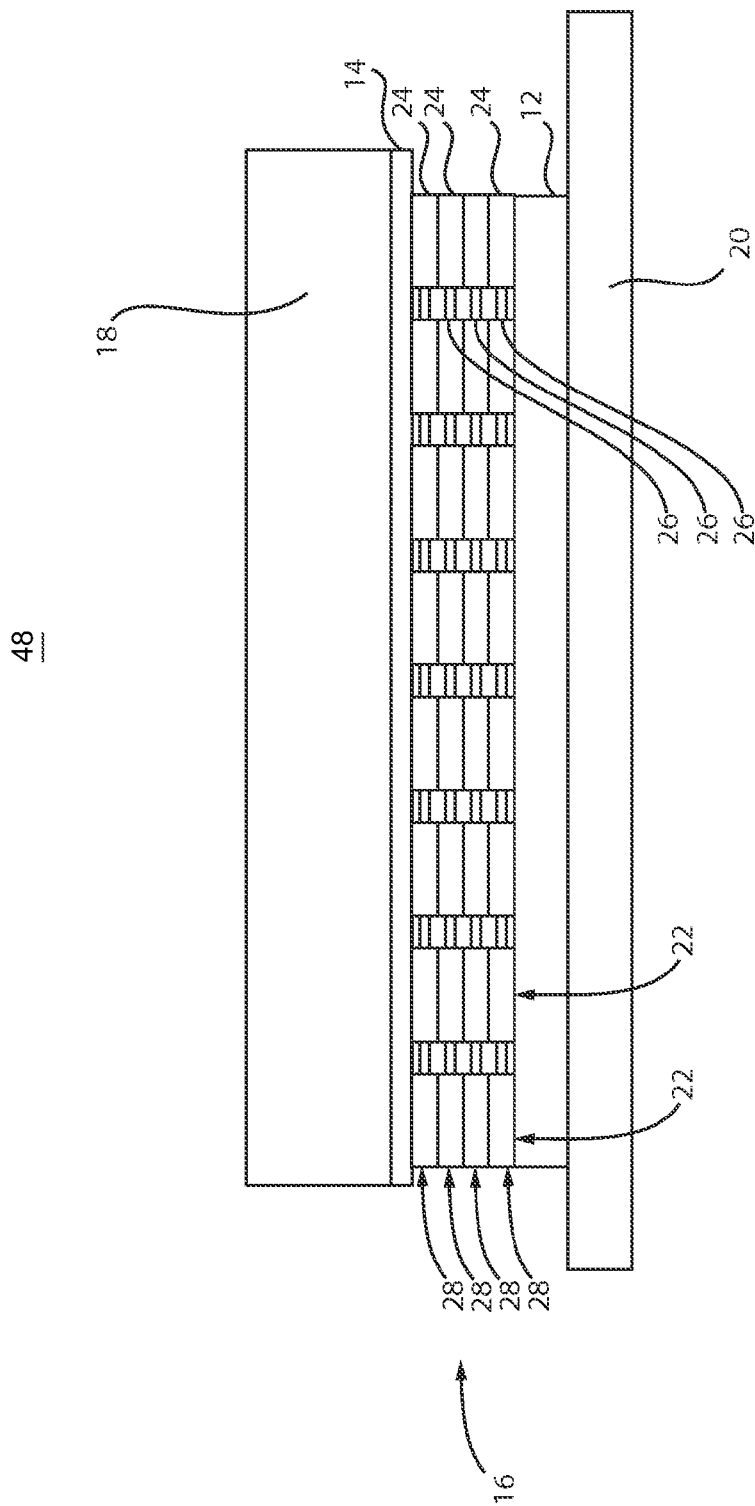
FIG. 5 is a side view of an illustrative heat sink system with a compliant sheet with links in place between pin portions in a heat sink stack in accordance with the present principles.

Referring to FIG. 5, another assembly 48 includes an air cooled arrangement without an enclosure. Assembly 48 includes another pin fin compliant heat sink (PFCHS) structure 16 disposed between the load 18 and the heat source 12. Structure 16 is also constructed by stacking and bonding sheets 28 which include layers of pin portions 24. The pin portions 24 preferably include a high thermally conductive material, such as, e.g., pure metals, metal alloys, thermally conductive carbon, etc. In particularly useful embodiments, the pin portions 24 include copper, silver, aluminum, gold, alloys of these and other metals, etc.

Upon stacking the layers 28, pin portions 24 form the columns 22. The pin portions 24 are connected to neighboring pin portions 24 by small, in some cases removable connecting elements or links 26. The pin portions 24 are bonded or otherwise conductively adhered (thermally) to vertically adjacent pin portions 24.

Figure 6:
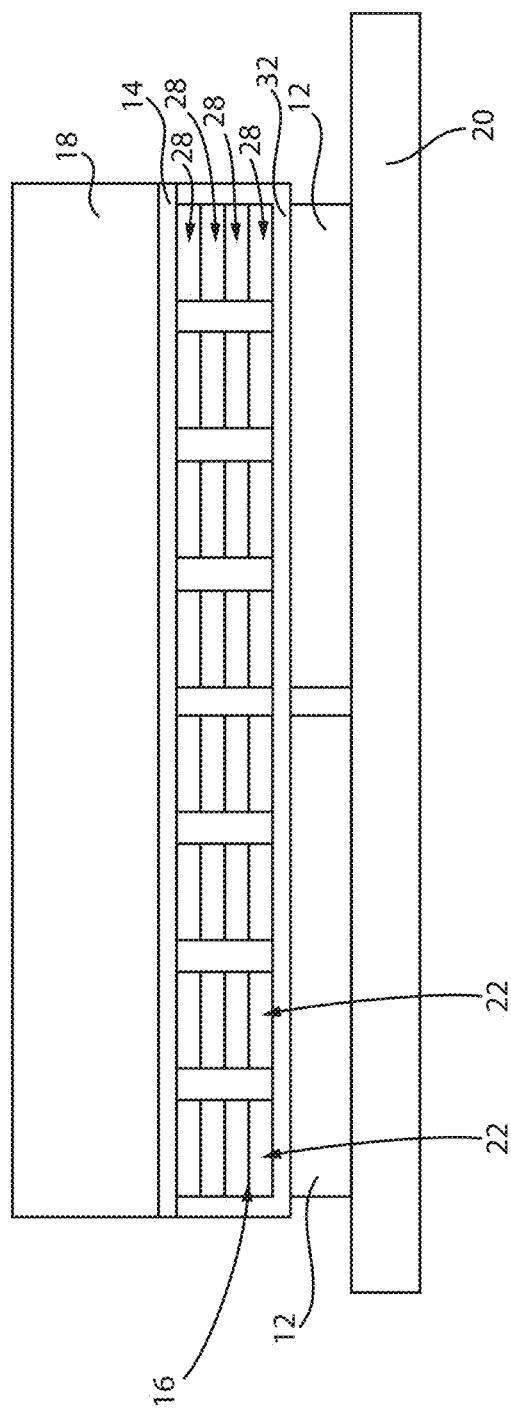
FIG. 6 is a side view of an illustrative heat sink system with links removed and showing two heat source devices in accordance with the present principles.

The structure 16 may be constructed layer-by-layer utilizing any number of bonding schemes, including, e.g., metal to metal thermo-compression (e.g., copper to copper, silver to copper, etc.), soldering, metal oxidation, eutectic bonding, electrical welding, etc. The links 26 are preferably small compared with the pin portions 24. The links 26 may have many configurations and are not needed between each adjacent pin portion 24 in a layer or sheet 28. In one embodiment, the structure 16 may provide alternating links 26 that skip every other link or follow other patterns. The stacked structure 16 is somewhat compliant as-is with all the links 26 intact; however, the stack structure 16 and the pins or columns 22 may be made more compliant by deleting/removing the connecting links 26 to leave individual free-standing pins 22 connected to only one or both or neither of the conformable bottom sheet 32 (not shown in FIG. 5) or to compliant sheet 14. FIG. 6 shows an assembly similar to that of FIG. 5 with the links 26 removed.

Referring to FIG. 6, the assembly illustratively shows two heat sources 12 disposed adjacent to each other. This highlights the compliant columns 22 (pin fins in this case without links), which accommodate any dimensional differences between the two heat sources 12.

Referring again to FIG. 5, compliant sheet 14 preferably includes a material which provides a degree of flexure to assist in the compliant aspect of the pins or columns 22. Compliant sheet 14 may include a thermally conductive material or a thermally insulating material. A thin compliant sheet 14 provides flexibility to accommodate tilted or non-flat chips (e.g., source 12) and level differences between chips (e.g., if multiple chips or devices are disposed over the structure 16). The compliant sheet 14 may include elastomeric elements or may be disposed on an elastomeric element to provide compliance and accommodate different heights or gap distances that need to be bridged between the pin stacks 22 and the load 18.

In particularly useful embodiments, the compliant sheet 14 may include one or more of metals, metal alloys (including e.g., solder), thermally conductive forms of carbon, composite materials (e.g., metals in a polymeric matrix), rubber, elastomers, epoxies or other elastomeric materials, etc. In one embodiment, the compliant sheet 14 may include corrugated metals, formed metals, etc. having a planar sheet formed thereon. The compliant sheet 14 may provide a bonding material as well as a flexure layer between the structure 16 and the load 18 or support structure. The bonding methods may include chemical or mechanical bonding to connect the structure 16 (e.g., pin portions 24) or to enclosures 34 and 46. The bonding method depends on the materials that are adjacent to the compliant sheet 14. In another embodiment, the compliant sheet 14 includes a container of compressible materials, such as air or other gas. For example, the compliant sheet 14 may include a flexible enclosure with pressurized gas sealed therein, or include a material matrix with gas bubbles or voids therein (e.g., spongy material).

The assembly 10 provides compliant heat sinks and results in a lower construction cost than for conventional compliant heat sinks. The present principles provide sheets 28 that are parallel with the chip/load surface and easily built up and configured to customize the assembly 10 for a given desired configuration.

Figure 7:
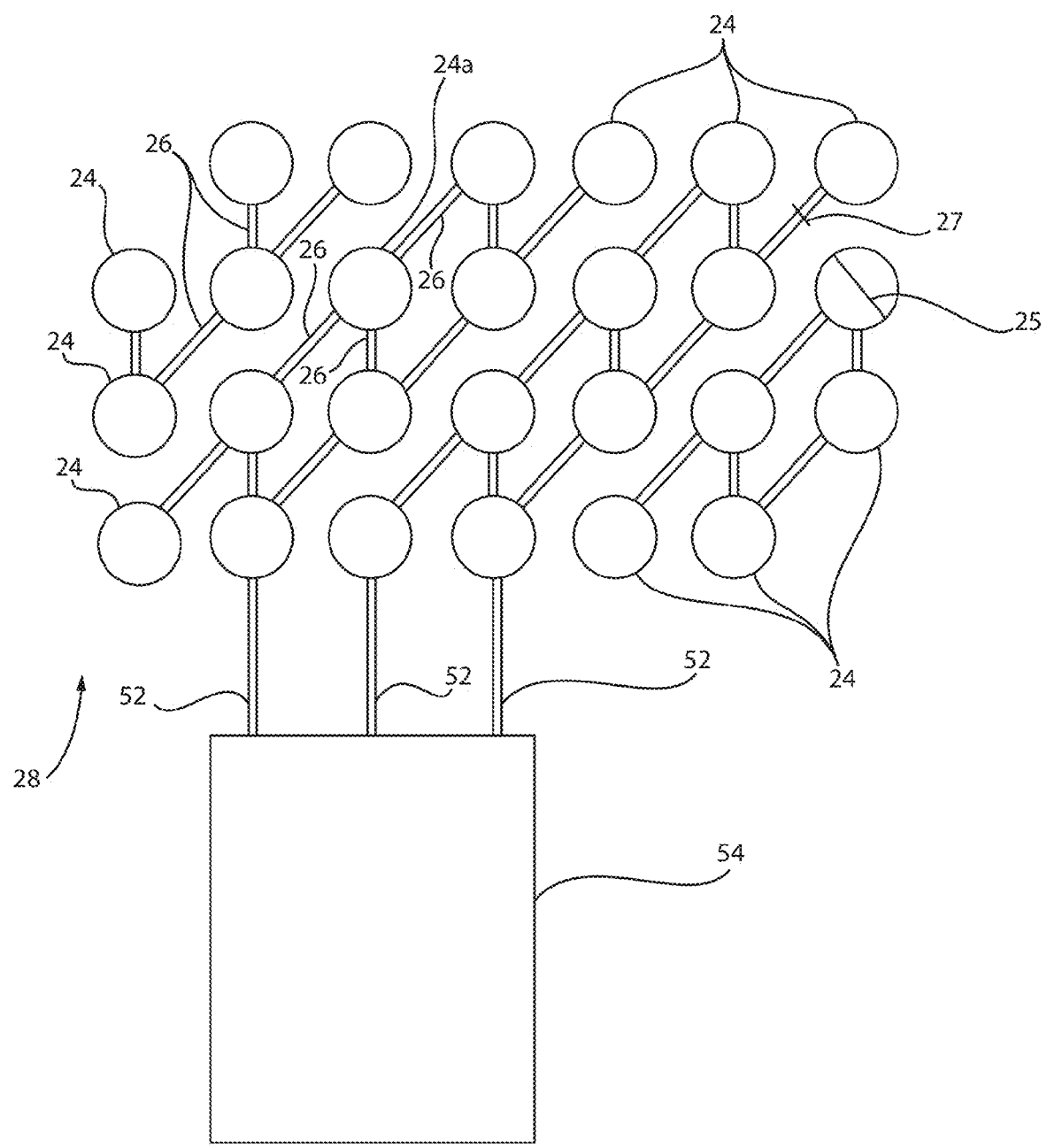
FIG. 7 is a top view of a single heat sink sheet showing a link pattern and handler in accordance with one illustrative embodiment.

Referring to FIG. 7, a portion of a sheet 28 is illustratively depicted having a handler or tool 54 attached thereto. The sheet 28 includes pin portions 24 which comprise a fin pin when stacked in a column (22 in FIG. 1). Sheet 28 includes an alternating link design (e.g., a hexagonal layout averaging three links 26 per pin portion of dot). An exemplary pin portion 24a shows three links 26 connected thereto. The three link configuration of links 26 provides a design suitable for thermo-compression bonding or the like. This design keeps the pin portions 24 in place under high bond loads while permitting fluid flow once assembled.

The links 26 are formed to have a smaller width 27 than a width 25 (or diameter) of the pin portions 24. A width ratio for width 25 to width 27 is between about 5:1 to about 4:1 (assuming uniform thickness between the pin portions 24 and the links 26) although other ratios may be employed. The width ratios are configured to make the sheet 28 flexible. As the width ratio approaches 1:1 the sheet 28 becomes more rigid. The flexibility provided by the sheet 28 as a result of the width ratio contributes directly to the compliance of the sheet 28 and to the stack of sheets 28 in the assembly 16. In other embodiments, the cross-sectional areas of the links 26 may be modified in both width and thickness to achieve a desired amount of flexibility for the sheet 28. Flexibility of the sheet 28 may include the ability to bend about its plane (curl) and/or be stretchable in one or more in-plane directions. These modes are provided by the dimensional ratios described above and/or due to configuration (e.g., orientation and number of links 26) shown in the figures.

Once the pin portions 24 are bonded or connected, the links 26 may be completely removed, a fraction of the links 26 may be removed or all of the links 26 may be maintained in the assembly. The links 26 may be removed mechanically or chemically. For example, the links 26 may be deleted or weakened with an etch process or could be separated mechanically with an edged die.

The sheets or layers 28 may be coupled to the handler or tool 54 with a set of links 52. The handler 54 may be employed as a connection point to assist in stacking and aligning the layers of the stack. Handler 54 may be gripped robotically, manually or by another tool to align and hold each layer 28 or plurality layers 28 during assembly of the structure 16. As illustratively depicted, the handler 54 may include one or more edges which may be employed to line up one or more dimensions of the layer 28. Each layer 28 may include its own handler or handlers 54. The handlers 54 of each layer 28 may be employed to line up the entire stack or two adjacent layers 28 as needed. Once aligned, the handlers 54 provide a way of supporting the stack during bonding, link removal, placement in an assembly 10 (FIG. 1), etc. The handlers 54 are removed from the stack as needed.

The pin fins in accordance with the present principles provide very effective cooling of semiconductors, particularly in environments where the best thermal interface materials cannot be utilized. The pin fins provide an inexpensive and commercially viable approach to the design and construction of heats sinks as compliant and forgiving platforms for accommodating one or more heat generating devices.

Figure 8:
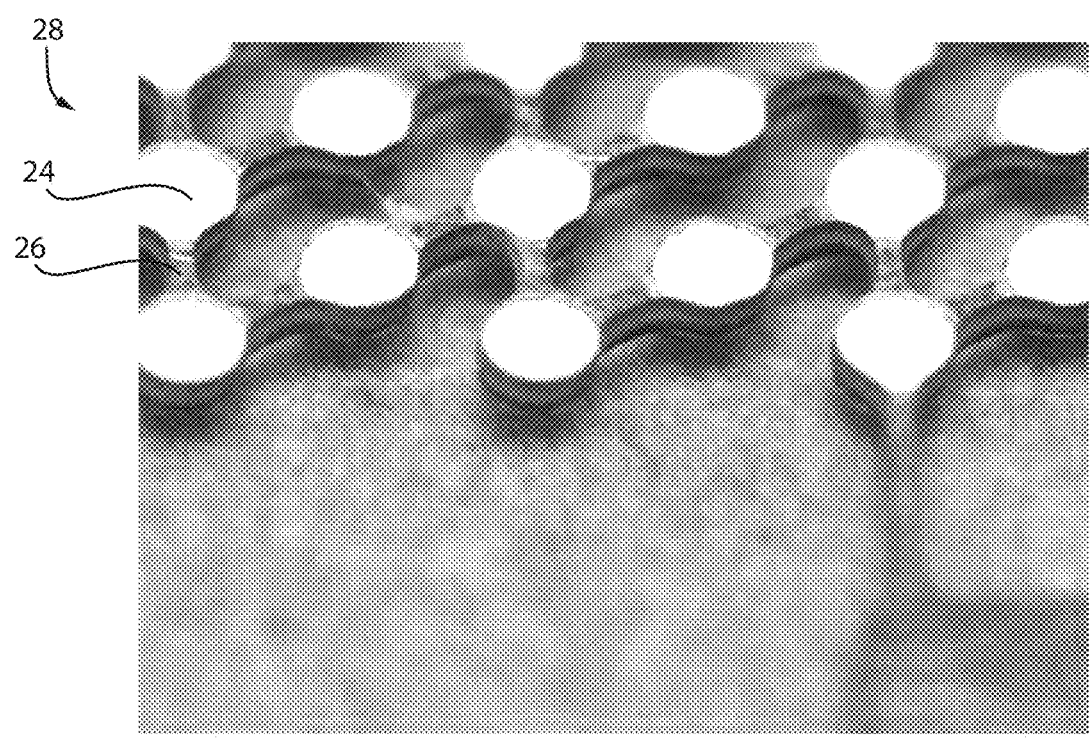
FIG. 8 is a perspective image of a single heat sink sheet showing a link pattern in accordance with one illustrative embodiment.

Referring to FIG. 8, an image 60 of a single flexible heat sink sheet 28 is shown in accordance with one illustrative embodiment. The single sheet 28 includes links 26 joining pin portions or disks 24. It should be understood that the discs 24 are depicted as circular, but may be minted or stamped as ovals, triangles, segments, curved segments, polygons, (e.g., hexagons, octagons, rectangles) or any other shape or combinations of shapes. The shapes may be selected based on desired air or liquid flow across the pins or columns once assembled. The dimensions and density of the pins may also be scaled in accordance with the amount of heat being sinked.

This involves a balance between convective heat transfer due to fluid passing over the pins and the conduction through the pins.

Figure 9:
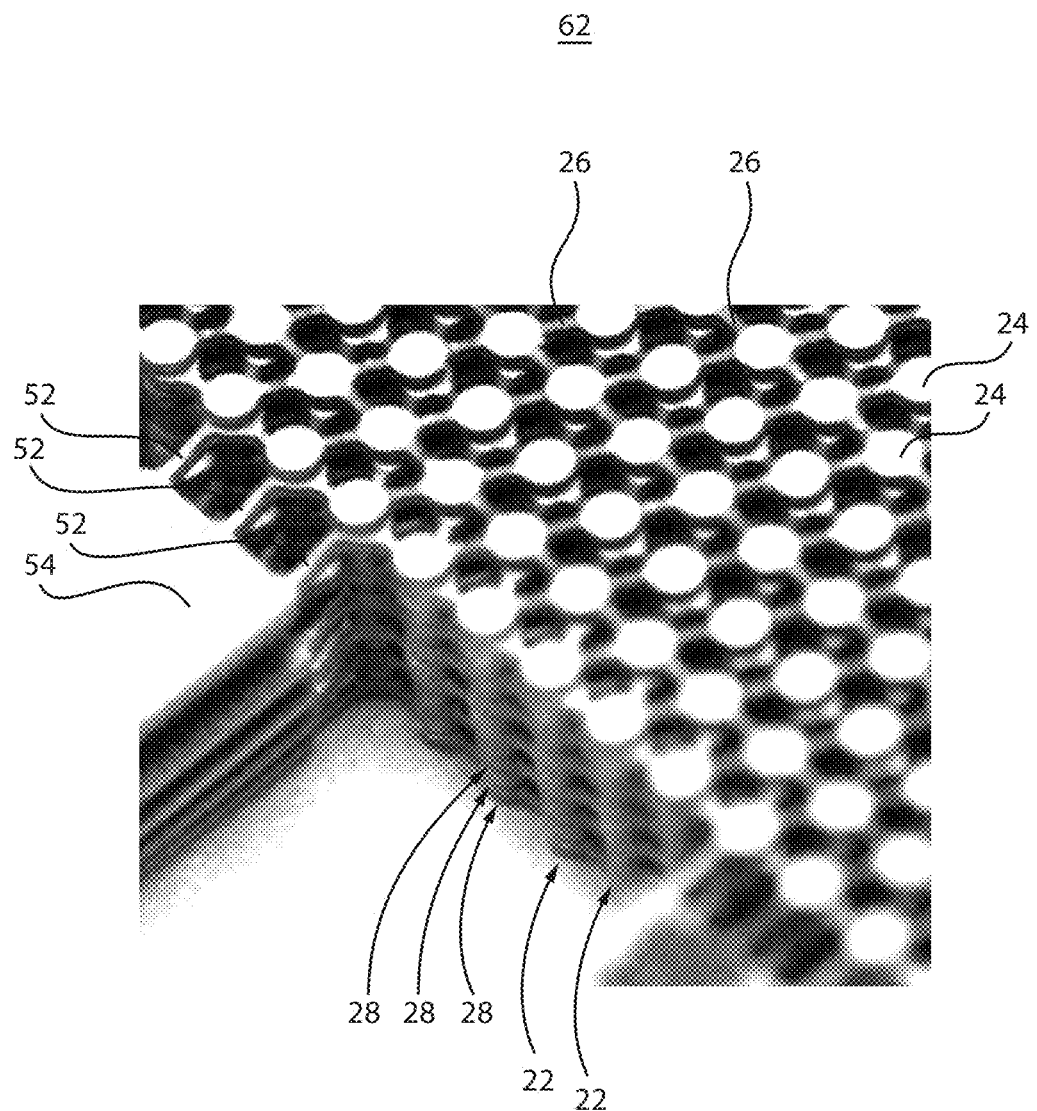
FIG. 9 is a perspective image a stack of heat sink sheets showing handlers in accordance with one illustrative embodiment.

In alternating layers, the links 26 are located in a different position as shown in FIG. 9 both to allow fluid flow between the pins in the resulting structure and to prevent bonding of the links 26 from one layer to another. This may be further or perhaps separately assured by making the links portions 26 thinner than the pin portions 24. These dimensions may be achieved during a stamping process, although other formation processes may be employed. The pin portions 24 may also be subjected to a cleaning process to remove oxides or other contaminants and to prepare the pin portions 24 for bonding. Such cleaning processes may include etching, e.g., with a diluted acid, etc.

Referring to FIG. 9, a stack of layers 28 is formed by bonding the pin portions to form columns 22, as depicted in an image 62. Handlers 54 are shown aligning the layers 28 for bonding the discs or pin portions 24 to form the pins or columns 22. Top and bottom sheets (not shown) are provided to be flexible enough to allow pins to move up and down relative to their neighbors once assembled. In this way, tilted, non-flat, level differences or other differences on or between chips can be accommodated.

The stack of sheets 28 shows links 26 alternating between sheets, preventing link to link bonding in the vertical direction and permitting fluid flow as assembled. Links 26 may be deleted or weakened with an etch process or could be separated mechanically with a edged die to further increase fluid flow or the links 26 may be left to increase conductive paths. Links 26 to edge areas including links 52 to handlers 54 (to locate active pin areas) can be removed entirely. In this way, the array of pins can be customized to fit any size and shape load configuration or support structure configuration.

It should be understood that the present embodiments have described a horizontally disposed configuration where the load is placed over the support structure; however, the configuration may take on many forms. For example, pin fins may be employed on multiple sides of a heat source, about its periphery or limited to particular areas of portions of the heat source. In addition, the heat source (or the support structure) may be vertically or transversely disposed with pin fins at any location.

Figure 10:
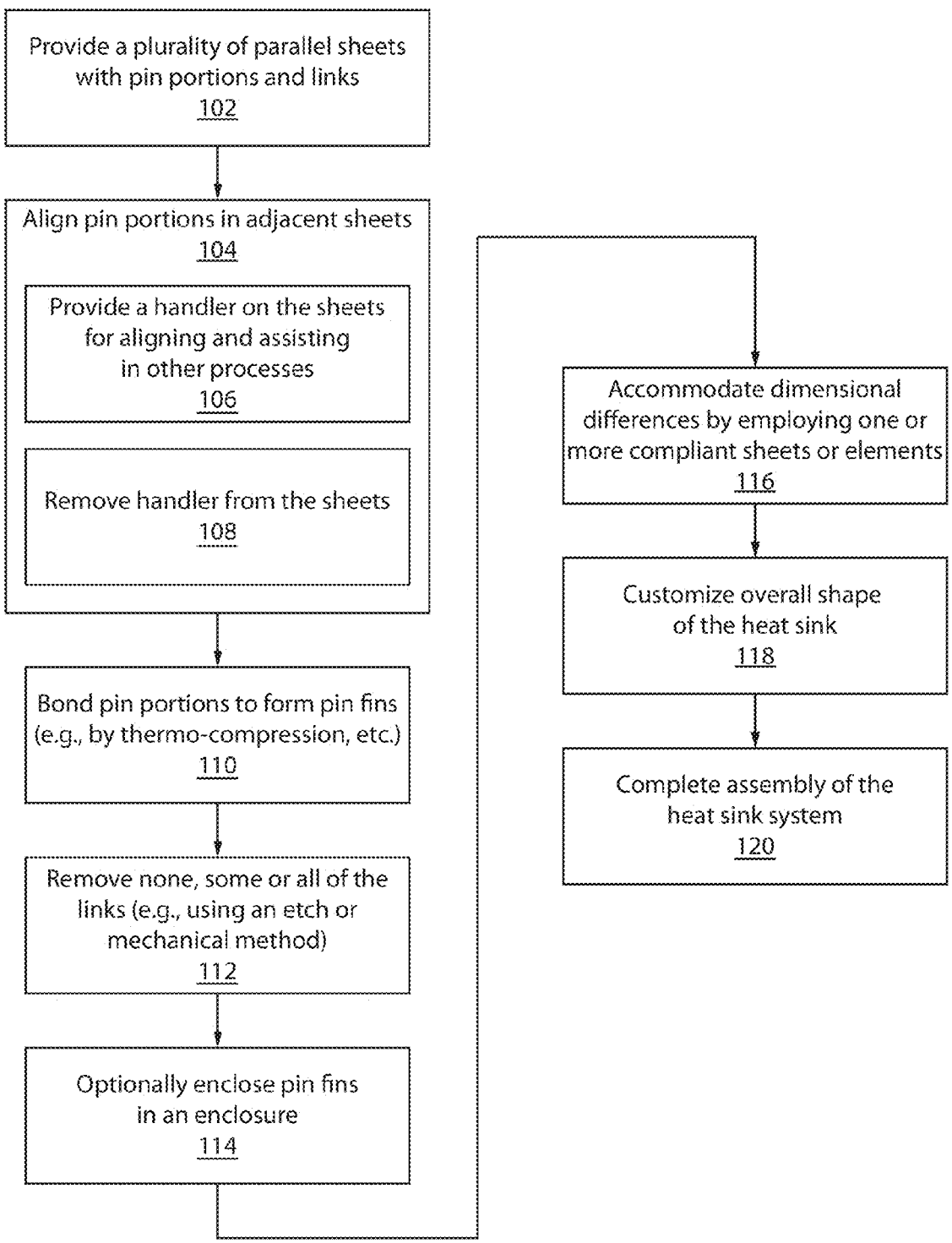
FIG. 10 is a block/flow diagram showing a method for fabricating a heat sink stack in accordance with illustrative embodiments.

Referring to FIG. 10, a block diagram shows a method for forming a compliant heat sink in accordance with one embodiment. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 102, a plurality of sheets are provided parallel with a surface of a heat source, where each sheet includes a plurality of pin portions spaced apart from each other in a planar arrangement and includes removable links connecting adjacent pin portions. The pin portions may include at least one shape comprising at least one of a circle, an oval, a segment, a polygon, etc. Each sheet is flexible, and the dimensions and number of links are set to provide the flexibility of each sheet.

In block 104, the pin portions of adjacent sheets or layers are aligned. The layers with the pin portions are likely to be stacked and bonded on or in a fixture or other structure off-board. In block 106, aligning includes providing a removable handler connected to each sheet to permit handling and alignment of the sheets with other sheets. In block 108, the handler is removed from each sheet after assembly is completed or as needed. The removal of the handler may occur after the bonding step.

In block 110, the pin portions of the adjacent sheets are bonded to form a stack of bonded sheets where the pin portions form pin fins extending transversely from a heat source. The bonding may include at least one of thermo-compression, oxidation, soldering, welding, eutectic bonding etc.

In block 112, at least a portion of the links may be removed to permit or improve convective fluid flow between the pin fins and/or to increase compliance by reducing rigidity of the stacked layers. The links may be removed by, e.g., employing an etch process and/or employing a mechanical die to cut away the links.

In block 114, the pin fins (layers) may be enclosed in an enclosure to guide coolant flow. In one embodiment, the stack may be formed in the enclosure wherein the top and bottom layer of the enclosure are bonded to the pin fins. In another embodiment, the stack may be formed in the enclosure wherein the bottom layer of the enclosure is bonded to the pin fins. The bonding may include at least one of thermo-compression, oxidation, soldering, welding, eutectic bonding etc. The bonding may occur concurrently with the bonding of the pin portions.

In block 116, one or more compliant layers, sheets, or elements are coupled to the pin fins to accommodate mechanical loads and dimensional differences. In one embodiment, the compliant layer is connected to the pin fins (e.g., air cooled). In another embodiment, the compliant layer is connected to the top layer of the enclosure. In yet another embodiment, the compliant layer forms a portion of the enclosure (e.g., on the load side as opposed to heat source side). Note that the designation of "top layer" and "bottom layer" may be used interchangeably and are employed herein as a naming convention where the top layer corresponds to the load side and the bottom layer refers to the heat source side of the heat sink. Dimensional differences are accommodated when interfacing with the load by providing the compressible or compliant element, for example, an elastomeric sheet disposed in contact with and parallel to the plurality of sheets. The elastomeric sheet may include metal, polymeric materials, etc. and may or may not be thermally conductive. In another embodiment, the compliant (compressible) layer (14) comprises a compressible fluid such as air constrained between the mechanical load 18 and the pins (22).

In block 118, a shape of the plurality of sheets (heat sink) may be customized in accordance with a load or loads or the heat sources being heat sinked. The customization may be performed concurrently with the removal of links or as a result of the removal of links in block 112. The customization includes forming the overall shape of the heat sink to the shapes of the heat source or heat sources that will be serviced by the heat sink.

In block 120, the heat sink system/assembly is completed. The heat sink may be delivered to an integration location (e.g., a support structure) and assembled (e.g., as depicted in the previously described FIGS.). Processing continues as needed.

Having described preferred embodiments of a compliant pin fin heat sink and methods (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A heat sink, comprising:
a plurality of layers being disposed substantially parallel with a surface of a heat source, such layers including:
a plurality of pin portions spaced apart from each other in a planar arrangement wherein each layer of pin portions in the planar arrangement is formed separate from adjacent layers of the heat sink and the pin portions of the layers are stacked and bonded to adjacent pin portions of the layers to form pin fins extending in a transverse direction relative to the heat source to sink heat such that the pin fins in the planar arrangement are free of interconnects between adjacent pin fins; and
at least one compliant layer disposed between the pin fins and a mechanical load, the at least one compliant layer providing compliance such that the pin fins accommodate dimensional differences when interfacing with the heat source.

2. The heat sink as recited in claim 1, wherein the pin portions are bonded to at least one conformable layer, the conformable layer being coupled to the heat source.

3. The heat sink as recited in claim 2, wherein the at least one conformable layer includes a thermally conductive material.

4. The heat sink as recited in claim 2, wherein the at least one conformable layer includes an enclosure which encloses the pin fins to provide fluid flow in operation as a heat sink.

5. The heat sink as recited in claim 4, wherein the enclosure includes a second conformable layer bonded to the pin fins and being coupled to the mechanical load.

6. The heat sink as recited in claim 4, wherein the second conformable layer includes a thermally non-conductive material.

7. The heat sink as recited in claim 4, wherein the enclosure includes the at least one compliant layer coupled to the pin fins.

8. The heat sink as recited in claim 1, wherein the pin fins are configured to permit convective fluid flow therebetween using a coolant.

9. The heat sink as recited in claim 1, wherein the heat source includes single chip or multiple chip modules.

10. The heat sink as recited in claim 1, wherein each of the pin portions comprises a thickness, and the planar arrangement is disposed within a region of the thickness of the pin portions.

11. The heat sink as recited in claim 1, wherein the pin portions include at least one shape comprising at least one of a circle, an oval, a segment and/or a polygon.

12. The heat sink as recited in claim 1, wherein the at least one compliant layer further comprises at least one of an inlet or outlet.

13. The heat sink as recited in claim 1, wherein the at least one compliant layer comprises corrugated metal.

14. The heat sink as recited in claim 2, wherein the at least one conformable layer further comprises at least one of an inlet or outlet.

15. The heat sink as recited in claim 4, further comprising at least one flow blocking structure disposed laterally between the enclosure and the pin fins.

16. The heat sink as recited in claim 15, wherein the at least one flow blocking structure comprises an elastomer material.

* * * * *